United States Patent
Chen et al.

(10) Patent No.: US 8,779,788 B2
(45) Date of Patent: Jul. 15, 2014

(54) BURN-IN TESTING APPARATUS

(75) Inventors: Chi-Ren Chen, Tao-Yuan Hsien (TW); Chiang-Cheng Fan, Tao-Yuan Hsien (TW); Li-Hsun Chen, Tao-Yuan Hsien (TW)

(73) Assignee: Chroma Ate Inc., Tao-Yuan Hsien (TW)

( * ) Notice: Subject to any disclaimer, the term of this patent is extended or adjusted under 35 U.S.C. 154(b) by 396 days.

(21) Appl. No.: 13/340,758

(22) Filed: Dec. 30, 2011

(65) Prior Publication Data

US 2012/0326740 A1 Dec. 27, 2012

(30) Foreign Application Priority Data

Jun. 24, 2011 (TW) .............................. 100122180 A

(51) Int. Cl.
*G01R 31/10* (2006.01)
*G01R 31/20* (2006.01)

(52) U.S. Cl.
USPC ............ 324/750.05; 324/750.22; 324/757.05; 324/754.09

(58) Field of Classification Search
None
See application file for complete search history.

(56) References Cited

U.S. PATENT DOCUMENTS 6,356,094 B1 * 3/2002 Tverdy et al. ............ 324/757.05

* cited by examiner

*Primary Examiner* — Minh N Tang
(74) *Attorney, Agent, or Firm* — Rosenberg, Klein & Lee

(57) ABSTRACT

A testing apparatus includes a thermal control chamber including a test room, which temperature is controlled within a testing temperature range; a carrier frame including a direction guiding unit installed securely within the test room and formed with one guiding groove and a carrier rod extending through the guiding groove in the direction guiding unit; and a clamping unit mounted on the carrier rod for clamping a display-panel module securely, wherein, movement of the carrier rod transversely within the guiding groove relative to the direction guiding unit results in disposing the display-panel module to extend along one of several testing directions for undergoing a burn-in test.

11 Claims, 7 Drawing Sheets

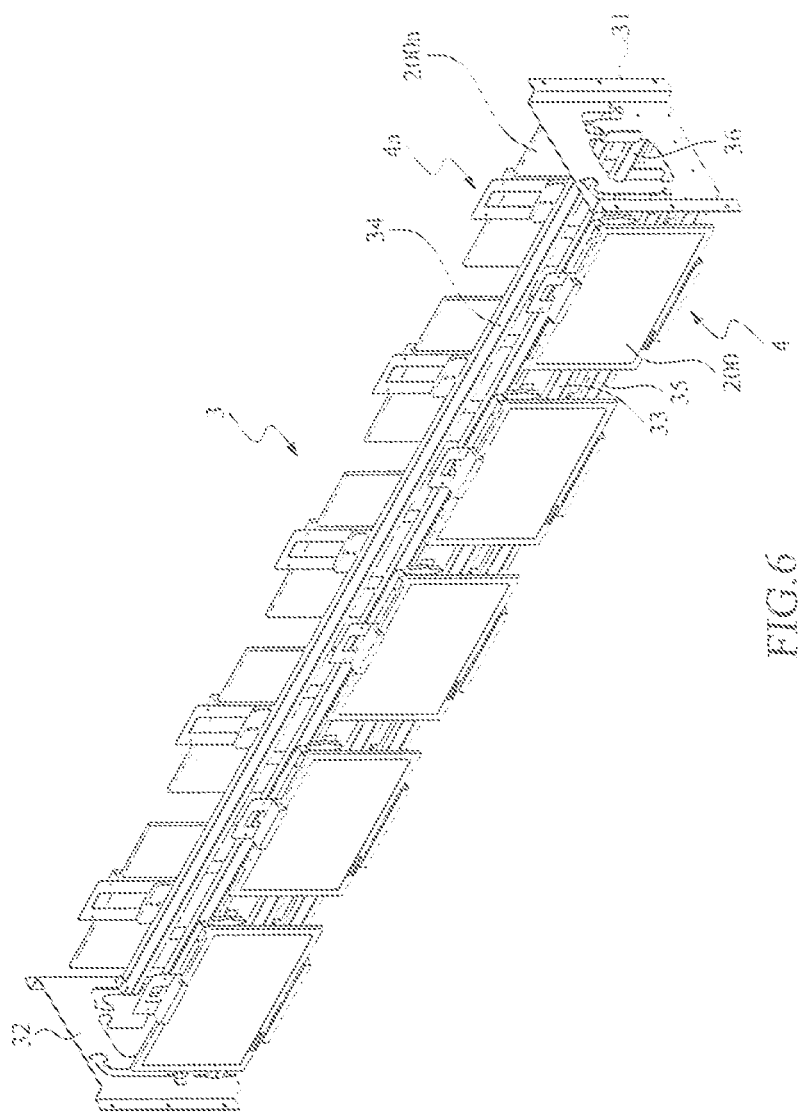

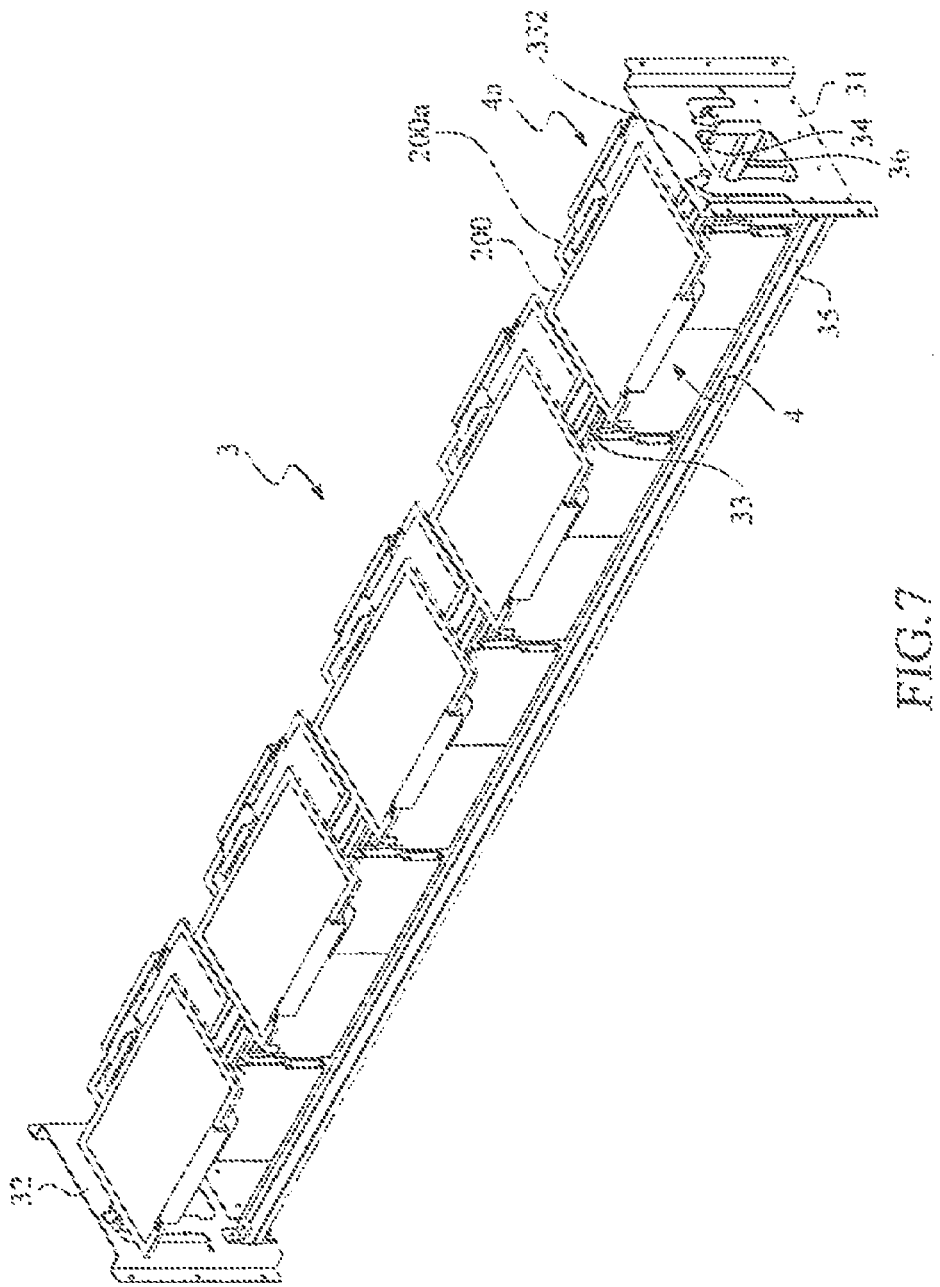

BURN-IN TESTING APPARATUS

This application claims the benefits of the Taiwan Patent Application Ser. No. 100122180 filed on Jun. 24, 2011, the subject matter of which is incorporated herein by reference.

BACKGROUND OF THE INVENTION

1. Field of the Invention

The present invention relates to a burn-in testing apparatus, more particularly to a burn-in testing apparatus in which a plurality of display-panel modules can be disposed adjustably along several testing directions when undergoing a burn-in test.

2. Description of the Prior Art

As far as electronic devices are concerned, more particularly to ones provided with display-panel module, the majority of the electronic devices possess complicated processing operation accomplished via complicated system and application software. The more the content of processing operation is complicated; the user of the electronic device wishes the shorter the operation time to finish the processing operation. Hence, the operation load of each electronic device becomes larger as days go by.

Due to the operation load of each electronic device becomes heavier and larger, the heat generated by each component of the electronic device rises relatively high during the operation, which, in turn, results in several disadvantages to the operation performance of the electronic device. In order to maintain a fine operation performance under the high temperature and still resulting in high efficient effects and standard, the manufacturers or the user will let the electronic module [components], semi-finished product or finished product undergone a severe test [i.e., under the high temperature or high speed] in order to test the operation performance, thereby determining whether the electronic device can be operated in stable manner or operation stability of the device. Such type of test is generally known as "Burn-In Test".

Since the electronic device of present days is in the trench to be compact in size, thickness and light-weighted in order to facilitate the user to carry along with or handle such that the electronic device is put under multiple directions during use. For instant when using a tablet PC [personal computer], the tablet PC is disposed at vertical and horizontal positions or at an inclined angle with respect to a support surface.

As far as burn-in test is concerned at present stage, the display-panel module of the electronic device is disposed along a single direction during the burn-in test operation. The test direction is not altered in accordance with the multiple usage positions of the electronic device. Under this condition, one cannot be 100 percent sure; the operation performance of the electronic device is maintained effectively or in stable manner under several disposed positions or directions. Hence, a change is required when carrying out the burn-in test of the display-panel module [or components] due to usage changed positions or directions of the electronic device by the users.

SUMMARY OF THE INVENTION

Therefore, the object of the present invention is to provide a testing apparatus, which can eliminate the single extending direction of the display-panel modules during the burn-in test. In other words, the prior art testing apparatus fails to provide the display-panel modules to extend along several testing direction during the burn-in test. Hence, the main object of the present invention is to provide a testing apparatus, which utilizes an appropriate direction guiding unit and a clamping unit for cooperatively disposing a plurality of the display-panel modules along several testing directions during the burn-in test.

The testing apparatus in accordance with the present invention is adapted to clamp at least one display-panel module securely such that the display-panel module is disposed adjustably along several testing directions for undergoing a burn-in test.

The testing apparatus accordingly includes a thermal control chamber, a carrier frame and a clamping unit. The thermal control chamber includes a test room, wherein the temperature of the test room is controlled within a testing temperature range. The carrier frame includes a direction guiding unit and a carrier rod. The direction guiding unit is installed securely within the test room and is formed with at least one guiding groove. The carrier rod extends through the guiding groove in the direction guiding unit.

The clamping unit is mounted on the carrier rod for clamping the display-panel module securely thereon. The testing apparatus of the present invention further includes a signal transmission module mounted on the carrier frame and is connected electrically to the display-panel module. Prior to conducting the burn-in test, movement of the carrier rod transversely within the guiding groove relative to the direction guiding unit results in disposing the display-panel module to extend along one of the several testing directions.

The testing apparatus of the present invention further includes a movable frame having a mounting door fixed on an inner side surface of the direction guiding unit for closing the test room during the burn-in test during the burn-in test and a holding rod fastened the mounting door in such a manner that during the burn-in test the holding rod is movable horizontally within the thermal control chamber so that the carrier frame, the clamping unit, the display-panel module and the signal transmission module are confined within the test room.

In one embodiment of the present invention, the carrier frame further includes a supporting rod attached securely to the direction guiding unit and extends parallel to and is disposed at an elevation below the carrier rod.

In one embodiment of the present invention, the clamping unit further includes a fixing frame having a frame body for mounting securely onto the carrier rod; a first carrier portion extending from the frame body along a first direction and bent transverse to the first direction; a second carrier portion extending from the frame body along a second direction opposite to the first direction, the second carrier portion being formed with a plurality pairs of retention holes; a first hook disposed on the first carrier portion; and a second hook attached adjustably to the second carrier portion via the retention holes. Preferably, the first and second hooks are made from elastomeric materials.

In the present embodiment, the signal transmission module is electrically connected the display-panel module in such a manner that the signal transmission module transmits testing signals to the display-panel module during the burn-in test. Each of the testing signals transmitted by the signal transmission module is an EDP [Embedded Displayport] signal. Preferably, a grill device serves as the thermal control chamber, and has an inner wall confining the thermal control chamber while the testing temperature range is from 45° C. to 60° C. The testing apparatus of the present invention further includes a driving unit installed adjacent to the direction guiding unit and connected mechanically to the carrier rod in order drive the carrier rod transversely within the guiding groove.

When compared to the prior art technique, by utilizing an appropriate direction guiding unit [such as the direction guiding units] and the clamping unit [such as the clamping units] in the testing apparatus of the present invention, the plurality of display-panel modules for undergoing a burn-in test can be disposed adjustably along several testing directions [i.e., the longitudinal length of each display-panel module can be placed at the vertical, horizontal or planar directions] during the burn-in test. The prior art technique fails to provide this meritorious feature.

BRIEF DESCRIPTION OF THE DRAWINGS

Other features and advantages of this invention will become more apparent in the following detailed description of the preferred embodiments of this invention, with reference to the accompanying drawings, in which:

FIG. 6 illustrates how a plurality of display-panel modules are disposed along a horizontal testing direction by cooperation of the carrier frame and the clamping unit employed in the testing apparatus of the present invention; and FIG. 7 illustrates how a plurality of display-panel modules are disposed along a planar testing direction by cooperation of the carrier frame and the clamping unit employed in the testing apparatus of the present invention.

DETAILED DESCRIPTION OF THE PREFERRED EMBODIMENT

The present invention relates to a testing apparatus, which is used widely for burn-in test of the display-panel module implemented in various electronic devices. In the following description, an embodiment is illustrated to provide a thorough understanding of the present invention; however it will be appreciated by one skilled in the art that variations of these specific details are possible while still achieving the results of the present invention.

Figure 1:
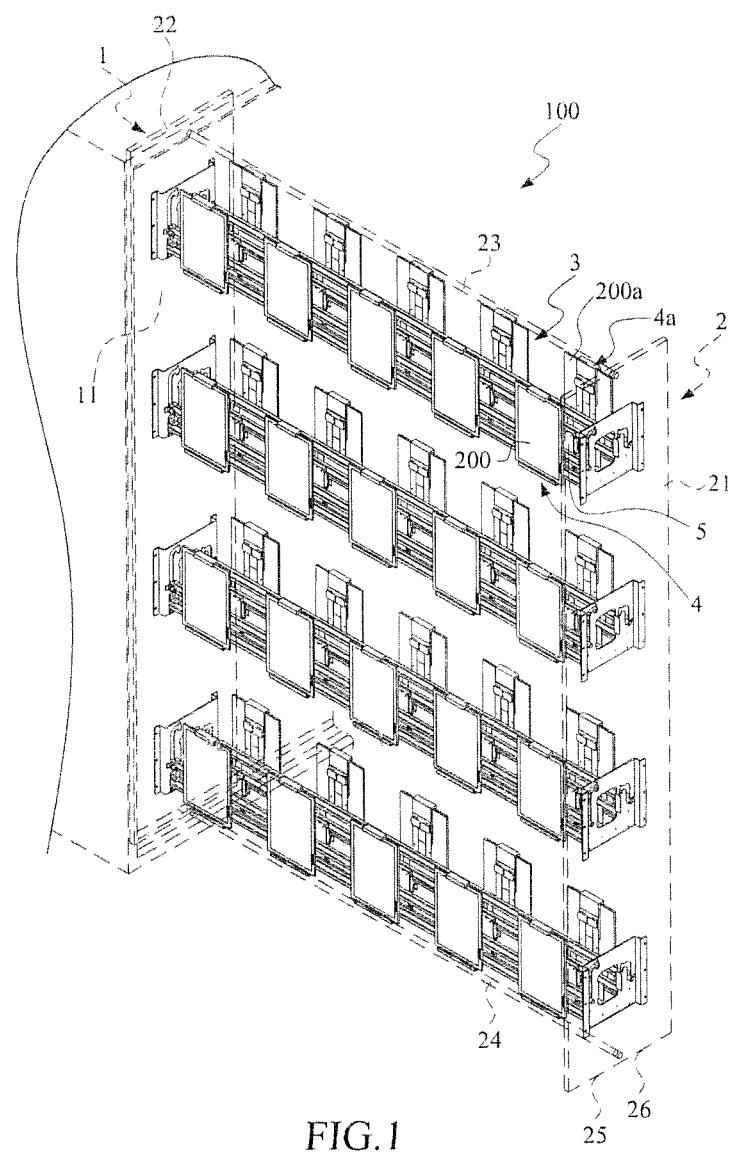
FIG. 1 shows a perspective view of a testing apparatus of the present invention.
Figure 2:
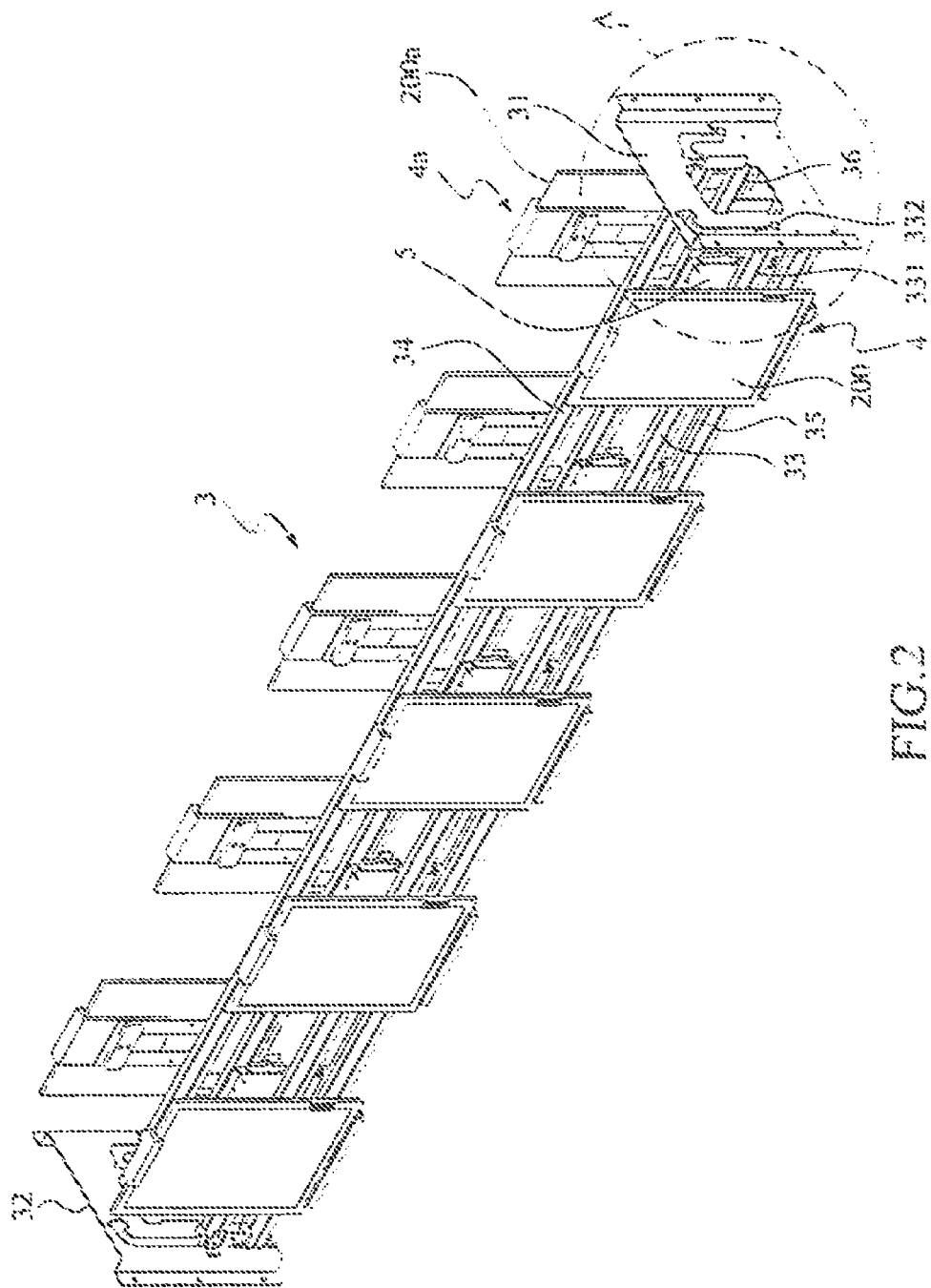
FIG. 2 shows a carrier frame and a clamping unit which cooperatively dispose a plurality of the display-panel modules along a horizontal testing direction in the testing apparatus of the present invention.
Figure 3:
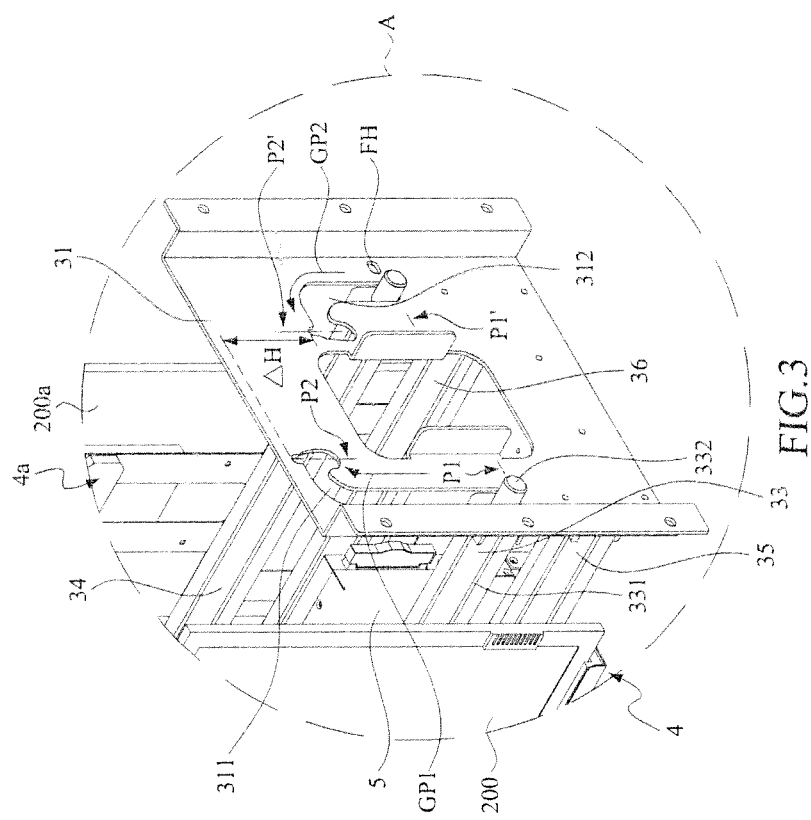
FIG. 3 illustrates an enlarged portion of an encircled section shown in FIG. 2.
Figure 4:
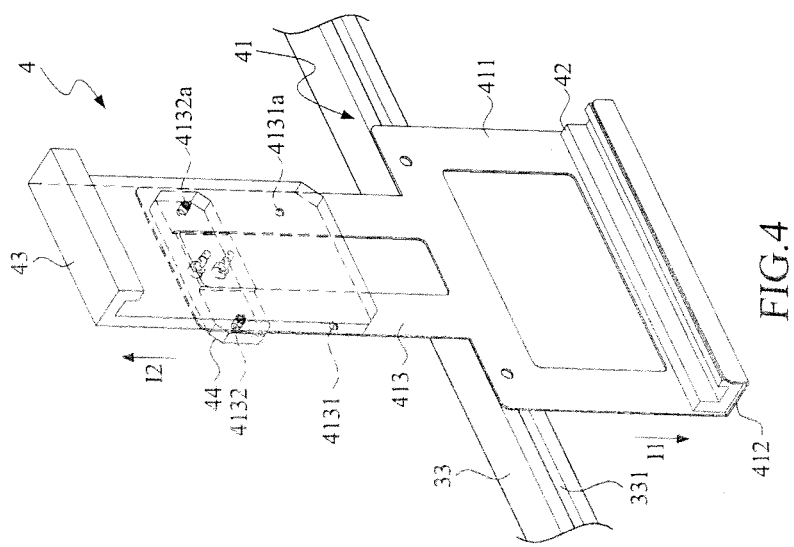
FIG. 4 illustrates interrelationship between the carrier frame and the clamping unit employed in the testing apparatus of the present invention.

Referring to FIGS. 1 and 4, wherein FIG. 1 shows a perspective view of a testing apparatus of the present invention; FIG. 2 shows a carrier frame and a clamping unit which cooperatively dispose a plurality of the display-panel modules along a horizontal testing direction in the testing apparatus of the present invention; FIG. 3 illustrates an enlarged portion of an encircled section shown in FIG. 2; and FIG. 4 illustrates interrelationship between the carrier frame and the clamping unit employed in the testing apparatus of the present invention.

As illustrated in FIG. 1, the testing apparatus 100 of the present invention is adapted to clamp a plurality of display-panel modules [200, 200a] securely such that the display-panel modules [200, 200a] are disposed adjustably along several testing directions for undergoing a burn-in test.

The testing apparatus 100 of the present invention includes a thermal control chamber 1, a movable frame 2, a plurality of carrier frames 3 [only one is used for explanation], a plurality of clamping units 4 [only two 4, 4a are used for explanation in FIG. 1] and a plurality of signal transmission modules 5 [only one is used for explanation in FIG. 3].

The thermal control chamber 1 includes a test room 11, wherein the temperature of the test room 11 is controlled within a testing temperature range. Preferably, a grill device is used as the thermal control chamber 1, and has inner wall confining the thermal control chamber 1 while the testing temperatures range from 45° C. to 60° C. during the burn-in test of the display-panel modules 200.

The movable frame 2 includes an inner mounting door 22, an outer mounting door 21, a pair of holding rods 23, 24, and a pair of castor rollers 25, 26. The outer mounting door 21 is used for closing the test room 11 during the burn-in test. The holding rod 23, 24 haves distal ends fastened movably to the mounting doors 21, 22 in such a manner that during the burn-in test the holding rods 23, 24 are movable horizontally within the thermal control chamber 1 such that the carrier frames 3, the clamping units 4, 4a, the display-panel modules 200, 200a and the signal transmission modules 5 are confined within the test room 11. The castor rollers 25, 26 are installed at a bottom end of the mounting door 21 to support the total weight of the movable frame 2, the carrier frames 3, the display-panel modules 200 and the signal transmission modules 5 and to facilitate movement of these components within the thermal chamber 1.

The carrier frame 3 includes two direction guiding unit 31, 32 installed securely within the test room 11, a pair of carrier rods 33, 34 extending through the guiding grooves 311, 312 in the direction guiding unit 31, 32 and a pair of supporting rods 35, 36.

In this embodiment, the direction guiding units 31, 32 in the form of plates are installed securely on the inner and outer mounting doors 21, 22. Each of the direction guiding units 31, 32 is formed with two inverted L-shaped guiding grooves 311, 312 [see FIG. 3] permitting extension of the carrier rods 33, 34 therethrough. Each inverted L-shaped guiding grooves 311, 312 has a lower vertical groove section extending along the direction GP1 with a lower resting positions P1, P1' and an upper horizontal groove section extending along the direction GP2 with an upper resting positions P2, P2' spatially communicated with the lower vertical groove section. In addition, each of the direction guiding unit 31, 32 is further formed with fastener hole FH which is used to fasten the respective carrier rod 33, 34 securely when the latter are disposed at the lower resting positions P1, P1' respectively.

Each of the carrier rods 33, 34 is further has an axial clamping slit 331, which is used for clamping a respective clamping unit 4,4a [see FIG. 4] and a distal end 332 extending through the guiding groove 311 within the respective direction guiding unit 31 [see FIG. 3].

The supporting rods 35, 36 have distal ends attached securely to the direction guiding units 31, 32 and extend parallel to and at an elevation below the carrier rods 33, 34 once the display-panel module 200 are mounted on the carrier frame 3 [see FIG. 2] via the supporting rods 35, 36 and the carrier rods 33, 34 for undergoing the burn-in test, the longitudinal length of each display-panel module 200 in the respective row of display-panel modules extend in the vertical direction. Alternately, the longitudinal length of each display-panel module 200 in the respective row of display-panel modules 200 extend in the horizontal direction once the display-panel modules 200 are mounted on the carrier frame 3 [see FIG. 6] for undergoing the burn-in test.

The clamping units 4, 4a may have the same structure and they are mounted the carrier rods 33, 34 respectively in order to clamp the display-panel modules 200 securely. Detailed description of the respective clamping unit is given below.

As best shown in FIG. 4, each clamping unit 4, 4a includes a fixing frame 41 having a frame body 411 for mounting securely onto the carrier rod 33, a first carrier portion 412 extending from the frame body 411 along a first direction I1 and bent transverse to the first direction I1, a second carrier portion 413 extending from the frame body 411 along a second direction I2 opposite to the first direction I1. Preferably, the second carrier portion 413 is formed with a plurality pairs of retention holes 4131, 4131a.

The clamping unit 4 further includes a first hook 42 disposed on the first carrier portion 412 and a second hook 43 attached adjustably to the second carrier portion 413 such that after placing a fastener block 44 behind the second carrier portion 413, a pair of fastener screws can be inserted through the fastener block 44 into the retention holes 4131, 4131a in the second carrier portion 413, thereby adjustably connecting the first and second hooks 42, 43. Preferably, the first and second hooks 42, 43 are made from elastomeric materials, such as rubber material and Teflon or other hard material, which are unable to cause scratches onto the display-panel modules 200.

As shown in FIG. 4, one can manipulate the clamping unit 4 as mentioned in the above paragraph in order to dispose the row of display-panel modules 200 as best shown in FIG. 2 [i.e., the plurality of display-panel modules 200 extends adjustably along one of several testing directions for undergoing the burn-in test].

In this embodiment, the testing apparatus 100 of the present invention further includes a plurality of signal transmission modules 5, each is mounted on the carrier frame 3 and is connected electrically to an adjacent one of the display-panel modules 200 in such a manner that the signal transmission module 5 transmits testing signals to the display-panel module 200 during the burn-in test. Generally, the signal transmission module 5 transmits the testing signal via an appropriate connector [not shown]. Preferably, each of the testing signals transmitted by the signal transmission module 5 is an EDP [Embedded Displayport] signal.

In addition to disposing the row of display-panel modules 200 as best shown in FIG. 2, where the longitudinal length of each display-panel module 200 extends in the vertical direction, the row of display-panel modules 200 can be disposed to extend along several testing directions [i.e., the longitudinal length of each display-panel module 200 in the respective row of display-panel modules extend in the horizontal or planar direction for undergoing the burn-in test] since movement of the carrier rods 33, 34 transversely within the inverted L-shaped guiding groove 311, 312 relative to the direction guiding unit 31, 32 results in disposing the display-panel module to extend along one of the several testing directions.

Figure 5:
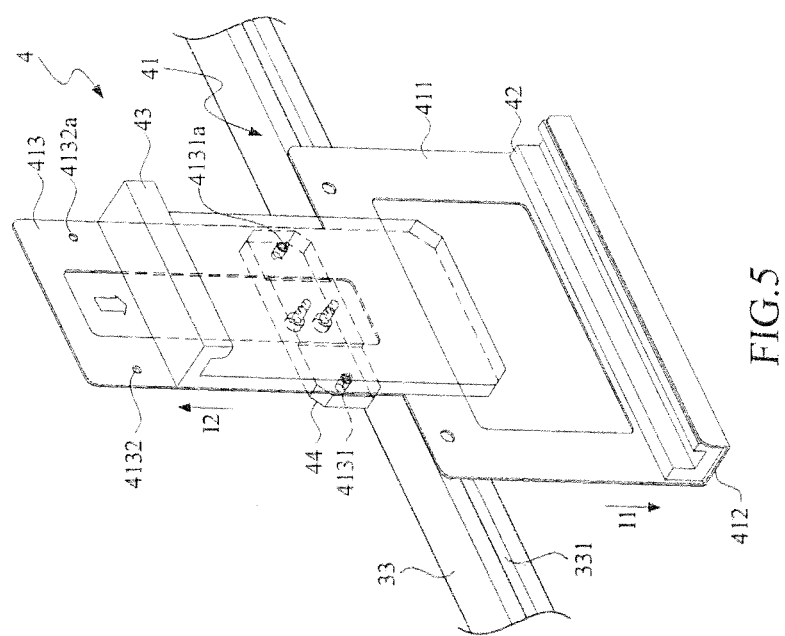
FIG. 5 illustrates how a distance between first and second hooks in the clamping unit is adjusted in order to clamp a display-panel module securely in the testing apparatus of the present invention.

FIG. 5 illustrates how a distance between first and second hooks 42, 43 in the clamping unit 4 is adjusted in order to clamp a respective display-panel module 200 therebetween securely in the testing apparatus 100 of the present invention. FIG. 6 illustrates how a plurality of display-panel modules 200 are disposed along a horizontal testing direction by cooperation of the carrier frame 3 and the clamping unit 4 employed in the testing apparatus 100 of the present invention.

When it is desired to clamp the display-panel module 200 to extend along a horizontal testing direction [i.e., the longitudinal length of each display-panel module extend along the horizontal direction], the relative distance between the first and second hooks 42, 43 is adjusted via the fastener block 44 and the retention holes 4131, 4131a in the second carrier portion 413. Hence the row of the display-panel modules 200 extend along the horizontal testing direction, as best shown in FIG. 6.

Referring to FIG. 3 and FIG. 7, after letting the display-panel modules 200 undergone the burn-in test under the position shown in FIG. 2 and FIG. 6, and in case it is desired to clamp the display-panel module 200 to extend along a planar testing direction [i.e., the display-panel modules lie flat on the carrier rods 33, 34], as best shown in FIG. 7, for further going another burn-in test. Under this condition, the carrier rods 33, 34 can be moved simultaneously upward along the direction GP1, GP2 from the lower resting positions P1, P1' in order to dispose the distal ends of the carrier rods 33, 34 at the upper resting positions P2, P2', which are located at a higher elevation ΔH than the lower resting positions P1, P1'. Hence, the display-panel modules 200 extend along the planar testing direction, as best shown in FIG. 7.

Referring to FIG. 3, it is obvious from FIG. 3 that the resting positions P2, P2' are located at the higher elevation ΔH than the resting positions P1, P1' [i.e., the distal ends 332 of the carrier rods 33,34 rest on the resting positions P2, P2' in the inverted L-shaped guiding groove 311, 312 in the direction guiding unit 31, 32].

The testing apparatus 100 of the present invention further includes a driving unit 50 [see FIG. 3] installed adjacent to the direction guiding unit 31, 32 and connected mechanically to the carrier rods 33,34 in order drive the carrier rods 33, 34 transversely within the inverted L-shaped guiding grooves 311,312 along the direction GP1, GP2.

As explained above, to those skilled in the art person, by reading the above-mentioned paragraphs and compared with the prior art burn-in testing apparatus, by utilizing an appropriate direction guiding unit [such as the direction guiding units 31, 32] and the clamping unit [such as the clamping units 4, 4a] in the testing apparatus of the present invention, the plurality of display-panel modules for undergoing a burn-in test can be disposed adjustably along several testing directions [i.e., the longitudinal length of each display-panel module can be placed at the vertical, horizontal or planar directions] during the burn-in test. The prior art technique fails to provide this meritorious feature.

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A testing apparatus adapted to clamp at least one display-panel module securely such that the display-panel module is disposed adjustably along several testing directions for undergoing a burn-in test, the testing apparatus comprising:
   a thermal control chamber including a test room, wherein the temperature of said test room is controlled within a testing temperature range;
   a carrier frame including
      a direction guiding unit installed securely within said test room and formed with at least one guiding groove, and
      a carrier rod extending through said guiding groove in said direction guiding unit; and
      a clamping unit mounted on said carrier rod for clamping the display-panel module securely;
   wherein, movement of said carrier rod transversely within said guiding groove relative to said direction guiding unit results in disposing the display-panel module to extend along one of the several testing directions.

2. The testing apparatus according to claim 1, further comprising a signal transmission module mounted on said carrier frame and connected electrically to the display-panel module in such a manner that said signal transmission module transmits testing signals to the display-panel module during the burn-in test.

3. The testing apparatus according to claim 2, further comprising a movable frame including
 a mounting door for closing said test room during the burn-in test with said direction guiding unit being fixed on an inner side surface of said mounting door; and
 a holding rod fastened said mounting door in such a manner that during the burn-in test said holding rod is movable horizontally within said thermal control chamber so that said carrier frame, said clamping unit, the display-panel module and the signal transmission module are confined within said test room.

4. The testing apparatus according to claim 3, wherein said mounting door is installed with a castor roller at a bottom end thereof to support and facilitate movement of said mounting door.

5. The testing apparatus according to claim 2, wherein each of said testing signals transmitted by said signal transmission module is an EDP [Embedded Displayport] signal.

6. The testing apparatus according to claim 1, wherein said carrier frame further includes a supporting rod attached securely to said direction guiding unit and extending parallel to and at an elevation below said carrier rod.

7. The testing apparatus according to claim 1, wherein said clamping unit includes
 a fixing frame having a frame body for mounting securely onto said carrier rod;
 a first carrier portion extending from said frame body along a first direction and bent transverse to said first direction;
 a second carrier portion extending from said frame body along a second direction opposite to said first direction, said second carrier portion being formed with a plurality pairs of retention holes;
 a first hook disposed on said first carrier portion; and
 a second hook attached adjustably to said second carrier portion via said retention holes.

8. The testing apparatus according to claim 7, wherein said first and second hooks are made from elastomeric materials.

9. The testing apparatus according to claim 1, wherein said thermal control chamber is a grill device confining said thermal control chamber while said testing temperature range is from 45° C. to 60 C.

10. The testing apparatus according to claim 1, further comprising a driving unit installed adjacent to said direction guiding unit and connected mechanically to said carrier rod in order drive said carrier rod transversely within said guiding groove.

11. The testing apparatus according to claim 1, wherein said guiding groove in said direction guiding unit is an inverted L-shaped and having a lower vertical groove section and an upper horizontal groove section spatially communicated with said lower vertical groove section.

\* \* \* \* \*